United States Patent
Teshima et al.

(10) Patent No.: US 7,759,623 B2
(45) Date of Patent: Jul. 20, 2010

(54) SILICON PHOTOELECTRIC MULTIPLIER (VARIANTS) AND A CELL FOR SILICON PHOTOELECTRIC MULTIPLIER

(75) Inventors: Masahiro Teshima, Unterschleissheim (DE); Razmik Mirzoyan, Unterschleissheim (DE); Boris Anatolievich Dolgoshein, Proletarsky prospekt, d.6, k.2, kv.161, 115522 Moscow, Russian Federation, Moscow (RU); Sergey Nikolaevich Klemin, Moscow (RU); Elena Viktorovna Popova, p.Obolensk (RU); Leonid Anatolievich Filatov, Moscow (RU)

(73) Assignees: Max-Planck-Gesellschaft zur Foerderung der Wissenschaften E.V., Munich (DE); Boris Anatolievich Dolgoshein, Moscow (RU)

( * ) Notice: Subject to any disclaimer, the term of this patent is extended or adjusted under 35 U.S.C. 154(b) by 198 days.

(21) Appl. No.: 11/568,646
(22) PCT Filed: May 5, 2005
(86) PCT No.: PCT/RU2005/000242
§ 371 (c)(1),
(2), (4) Date: Nov. 6, 2007
(87) PCT Pub. No.: WO2005/106971
PCT Pub. Date: Nov. 10, 2005

(65) Prior Publication Data
US 2008/0251692 A1 Oct. 16, 2008

(30) Foreign Application Priority Data
May 5, 2004 (RU) ............... 2004113616

(51) Int. Cl.
H01J 40/14 (2006.01)
(52) U.S. Cl. ............ 250/207; 250/214.1; 257/438
(58) Field of Classification Search .......... 250/207, 250/214.1, 214 R; 257/170, 438
See application file for complete search history.

(56) References Cited

U.S. PATENT DOCUMENTS
4,046,609 A * 9/1977 Digoy ............ 438/57
(Continued)

FOREIGN PATENT DOCUMENTS
EP 1840967 A1 10/2007
(Continued)

OTHER PUBLICATIONS
S. Cova et al, "Avalanche Photodiodes and Quenching Circuits for Single Photon Detection", Applied Optics, Apr. 20, 1956-1976, vol. 35, No. 12.
(Continued)

Primary Examiner—Georgia Y Epps
Assistant Examiner—Kevin Wyatt
(74) Attorney, Agent, or Firm—Porter, Wright, Morris & Arthur, LLP

(57) ABSTRACT

The invention relates to high-efficient light-recording detectors and can be used for nuclear and laser engineering, and in technical and medical tomography etc.

Figure 1:
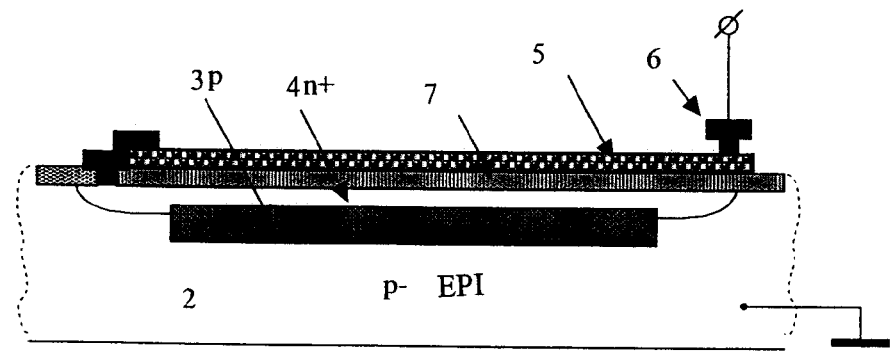

The inventive silicon photoelectric multiplier (variant 1) comprising a p++ type conductivity substrate whose dope additive concentration ranges from $10^{18}$ to $10^{20}$ cm$^{-3}$ and which consists of cells, each of which comprises a p− type conductivity epitaxial layer whose dope additive concentration is gradually changeable from $10^{18}$ to $10^{14}$ cm$^{-3}$ and which is grown on the substrate, a p− type conductivity layer whose dope additive concentration ranges from $10^{15}$ to $10^{17}$ cm$^{-3}$ and a n+ type conductivity layer whose dope additive concentration ranges from $10^{18}$ to $10^{20}$ cm$^{-3}$, wherein a polysilicon resistor connecting the n+ type conductivity layer with a feed bar is arranged in each cell on a silicon oxide layer and separating elements are disposed between the cells. Said silicon photoelectric multiplier (variant 2) comprising a n− type conductivity substrate to which a p++-type conductivity whose dope additive concentration ranges from $10^{18}$-$10^{20}$ cm$^{−3}$ is applied and consists of cells, wherein in each cell a polysilicon resistor is placed on a silicon oxide layer and separating elements are disposed between the cells.

27 Claims, 2 Drawing Sheets

U.S. PATENT DOCUMENTS

| | | | |
|---|---|---|---|
| 4,142,200 A | | 2/1979 | Mizushima et al. |
| 4,458,260 A | * | 7/1984 | McIntyre et al. ............ 257/438 |
| 4,586,068 A | | 4/1986 | Petroff et al. |
| 4,710,817 A | | 12/1987 | Ando |
| 5,021,854 A | | 6/1991 | Huth |
| 5,719,414 A | | 2/1998 | Sato et al. |
| 5,844,291 A | | 12/1998 | Antich et al. |
| 5,880,490 A | | 3/1999 | Antich et al. |
| 5,923,071 A | | 7/1999 | Saito |
| 6,352,238 B1 | | 3/2002 | Roman |
| 6,838,741 B2 | * | 1/2005 | Sandvik et al. ............ 257/438 |
| 7,268,339 B1 | | 9/2007 | Farrell et al. |
| 2001/0000623 A1 | | 5/2001 | Nozaki et al. |
| 2002/0139970 A1 | | 10/2002 | Iwanczyk et al. |
| 2005/0167709 A1 | | 8/2005 | Augusto |
| 2005/0205930 A1 | | 9/2005 | Williams, Jr. |

FOREIGN PATENT DOCUMENTS

| | | |
|---|---|---|
| GB | 2143373 A | 2/1985 |
| JP | 63-124458 | 5/1988 |
| RU | 2086047 C1 | 7/1997 |
| RU | 2105388CA | 2/1998 |
| WO | WO 01/78153 A2 | 10/2001 |
| WO | WO 2003/003476 A2 | 1/2003 |
| WO | WO 2004/100200 A2 | 11/2004 |
| WO | WO 2005/048319 A2 | 5/2005 |
| WO | WO 2006/068184 A1 | 6/2006 |
| WO | WO 2006/111883 A2 | 10/2006 |
| WO | WO 2006/126026 A1 | 11/2006 |
| WO | WO 2006/126027 A2 | 11/2006 |
| WO | WO 2008/004547 A1 | 1/2008 |
| WO | WO 2008/011617 A2 | 1/2008 |
| WO | WO 2008/048694 A2 | 4/2008 |
| WO | WO 2008/052965 A1 | 5/2008 |
| WO | WO 2008/107718 A1 | 9/2008 |

OTHER PUBLICATIONS

M. Ghioni et al., "New Silicon Epitaxial Avalanche Diode for Single-Photon Timing at Room Temperature", Electronics Letters, Nov. 24 1988, 1476-1477, vol. 24, No. 24.

E. Sciacca et al., "Silicon Planar technology for Single Photon Optical Detectors", IEEE Transactions on Electron Devices, Apr. 2003, 918-925, vol. 50, No. 4, IEEE, U.S.

Z.Y. Sadygov et al., Avalanche Semiconductor Radiation Detectors, IEEE Transactions on Nuclear Science, pp. 1009-1013, Jun. 1996, vol. 43, No. 3.

G. Bondarenko et al., Limited Geiger-mode Microcell Silicon Photodiode:New Results, Nuclear Instrum. & Methods in Physics Research, 2000, pp. 187-192, vol. 442, Elsevier, NL.

B.F. Aull et al., Geiger-Mode Avalanche Photodiodes for Three-Dimensional Imaging, Lincoln Laboratory Journal, 2002, pp. 335-350, vol. 13, No. 2.

P. Buzhan, Silicon Photomultiplier and its Possible Applications, Nuclear Instruments & Methods in Physics Research, 2003, pp. 48-52, vol. 504, Elsevier, NL.

V. Saveliev, the Recent Devel. And Study of Silicon Photomultiplier, Nuclear Instrum. & Methods in Physics Research, 2004, pp. 528-532, vol. 535, Elsevier, NL.

Written Opinion of International Searching Authority, PCT/US2007/060621, International Filing Date Jan. 17, 2007.

International Preliminary Report on Patentability, PCT/JP2005/023503, International Filing Date, Dec. 21, 2005.

Written Opinion of International Searching Authority, PCT/US2004/38630, International Filing Date Nov. 5, 2004.

European Search Report, European Application No. 09013750.6,.

Renker, Properties of Avalanche Photodiodes . . ., Nuclear Instruments & Methods in Physics Research, Jun. 21, 2002, pp. 164-169, vol. 486. No. 1-2, Elsevier, Amsterdam, NL.

Renker, Photosensors, Nuclear Instruments & Methods in Physics Research, Apr. 9, 2004, pp. 15-20, vol. 527, No. 1-2, Elsevier, Amsterdam, Nl.

Buzhan et al., An advanced Study of Silicon Photomultiplier, ICFA Instrumentation Bulletin, 2001, pp, 1-14, vol. 23, Intern'l Comm. For Future Accelerators, Stanford, CA, US.

* cited by examiner

SILICON PHOTOELECTRIC MULTIPLIER (VARIANTS) AND A CELL FOR SILICON PHOTOELECTRIC MULTIPLIER

FIELD OF THE INVENTION

The invention relates to the field of semiconductor devices, particularly to detectors with high efficiency of light emission detection, including, visible part of the spectrum, and can be used in nuclear and laser technology, and also in industrial and medical tomography etc.

BACKGROUND OF THE INVENTION

The device for single-photon detection is known ["Avalanche photodiodes and quenching circuits for single-photon detection", S. Cova, M. Ghioni, A. Lacaita, C. Samori and F. Zappa APPLIED OPTICS Vol. 35 No. 12 20 Apr. 1996], the known device comprises a silicon substrate with an epitaxial layer made on it, said layer having on a surface a small (10-200 microns) region (a cell) of conductive type that is opposite to the given layer conductive type. The cell is supplied with reverse bias that exceeds breakdown voltage. When a photon is absorbed in this region the Geiger discharge takes place, said discharge is limited with an external damping resistor. Such single-photon detector has high light detection efficiency, however it has a very small sensitive region, and also it is not able to measure the light flux intensity. In order to eliminate these defects it is necessary to use a large number ($\geqq 10^3$) of such the cells located on a common substrate having $\geqq 1$ MM$^2$ of square. In this case each cell works as the above described photon detector, the device as a whole detects light intensity that is proportional to the number of the worked cells.

The device described in RU 2086047 C1, pub. 27 Jul. 1997, is accepted as the nearest prior art for the silicon photoelectric multiplier. The known device comprises a silicon substrate, a plenty of cells which sizes are 20-40 microns and which are located on a surface of said substrate in an epitaxial layer. A layer of special material is used as a damping resistor. Defects of this device are the following:

- decreasing short-wave light detection efficiency due to light absorption in the resistive layer;
- insufficiently high long-wave light detection efficiency because of a small depth of the sensitive region;
- availability of the optical connection between adjacent cells resulting in that the secondary photons appear in the Geiger discharge when one cell works, said photons can initiate actuation (lighting) of the adjacent cells. As a number of such photons is proportional to coefficient of amplification, this phenomenon limits the coefficient of amplification, efficiency, and single-electron resolution of the device. Furthermore the optical connection creates the excess noise factor, that degrades the ideal Poisson statistical characteristics and ability to account a small number of photons;
- technological complexity of resistive layer coating.

The technical effect is to raise the efficiency of light detection in a broad band of wave lengths with the coefficient of amplification up to $10^7$ due to increasing cell sensitiveness, to achieve high single-electron resolution, and to repress the excess noise factor.

The single cell structure (about 20 microns of the size) which is made in a thin epitaxial layer and which provides the uniformity of the electrical field in a depletion layer having about 1 micron of depth is accepted as the nearest prior art for the cell of the silicon photoelectric multiplier. The cell structure provides a low working voltage (M. Ghioni, S. Cova, A. Lacaita, G. Ripamonti "New epitaxial avalanche diode for single-photon timing at room temperature", Electronics Letters, 24, No 24 (1988) 1476). The defect of the known cell is insufficient detection efficiency of the long-wave part of the spectrum ($\geqq 450$ microns).

The technical effect is to raise the light detection efficiency in a broad band of wave lengths due to increased cell sensitiveness, to achieve the high single-electron resolution.

DETAILED DESCRIPTION OF THE INVENTION

Two embodiments of the silicon photoelectric multiplier, and the structure of the cell for the photoelectric multiplier are considered.

The technical effect is obtained (embodiment 1) due to a silicon photoelectric multiplier, comprising a p++ conductance type substrate having $10^{18}$-$10^{20}$ cm$^{-3}$ of a doping agent concentration, consists of identical cells independent of one another, each the cell includes an p conductance type epitaxial layer grown on a substrate, said layer having $10^{18}$-$10^{14}$ cm$^{-3}$ of the doping agent concentration varied gradiently, a p conductance type layer having $10^{15}$-$10^{17}$ cm$^{-3}$ of the doping agent concentration, a n+ conductance type layer having $10^{18}$-$10^{20}$ cm$^{-3}$ of the doping agent concentration, said n+ conductance type layer forming a donor part of a p-n boundary, a polysilicon resistor is located on a silicon oxide layer in each the cell, said polysilicon resistor connecting the n+ conductance type layer with a voltage distribution bus, and separating elements are disposed between the cells.

The technical effect is obtained (embodiment 2) due to a silicon photoelectric multiplier, comprising a n conductance type substrate, a p++ conductance type layer having $10^{18}$-$10^{20}$ cm$^{-3}$ of a doping agent concentration, said layer applied on said n conductance type substrate, consists of identical cells independent of one another, each the cell includes a p conductance type epitaxial layer having $10^{18}$-$10^{14}$ cm$^{-3}$ of the doping agent concentration varied gradiently, said p conductance type epitaxial layer grown on the p++ conductance type layer, a p conductance type layer having $10^{15}$-$10^{17}$ cm$^{-3}$ of the doping agent concentration, a n+ conductance type layer having $10^{18}$-$10^{20}$ cm$^{-3}$ of the doping agent concentration, a polysilicon resistor is located on a silicon oxide layer in each the cell, said polysilicon resistor connecting the n+ conductance type layer with a voltage distribution bus, and separating elements are disposed between the cells.

In the second embodiment the n conductance type substrate is used (instead of the substrate 1, used in the first embodiment of the device), said substrate forms along with the p-layers of the cells a reverse n-p boundary.

FIG. 1 presents a structure of the cell for the silicon photoelectric multiplier pursuant to the invention.

Figure 2:
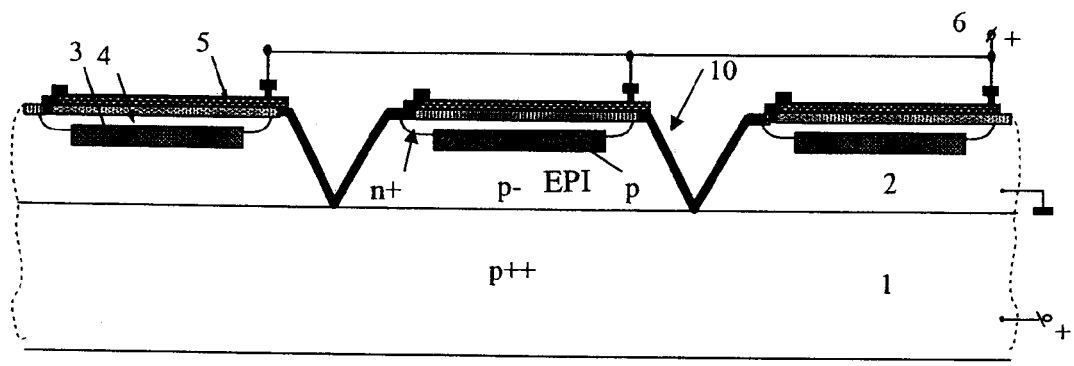

FIG. 2 presents the first embodiment of the silicon photoelectric multiplier.

Figure 3:
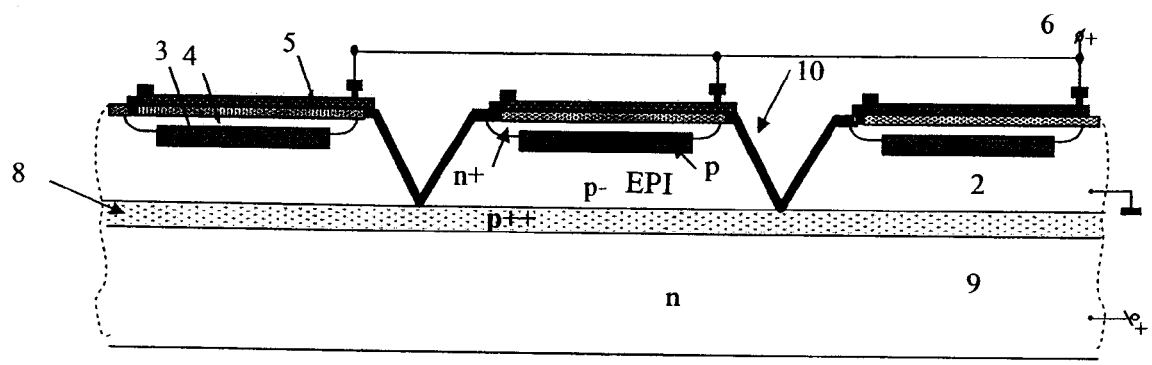

FIG. 3 presents the second embodiment of the silicon photoelectric multiplier.

Figure 4:
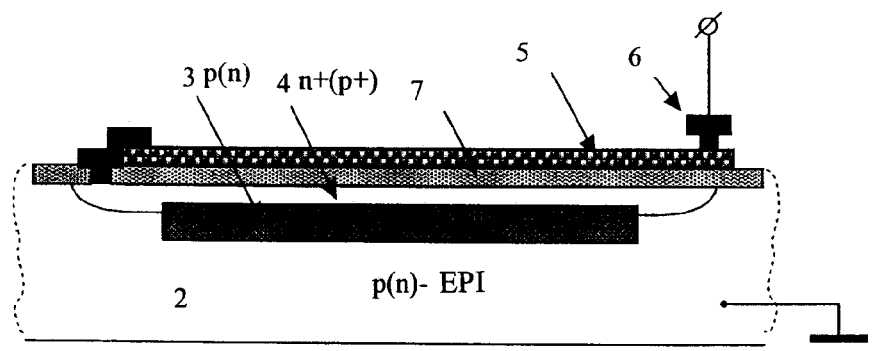

FIG. 4 presents the structure of the cell pursuant to the invention (inverse embodiment).

Figure 5:
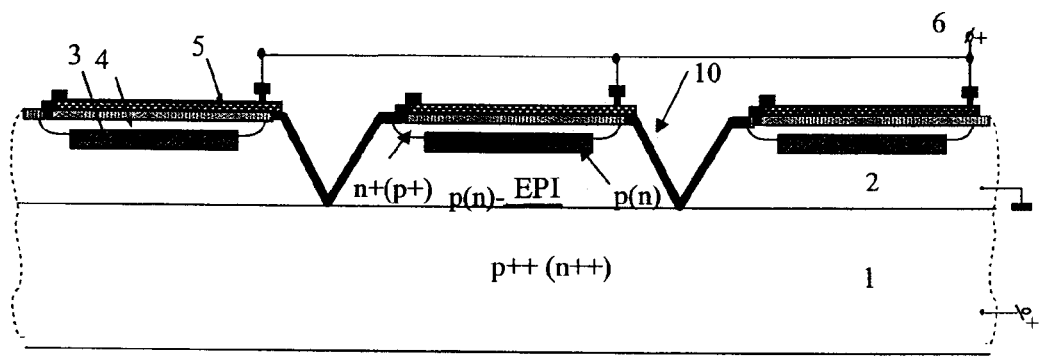

FIG. 5 presents the first embodiment of the silicon photoelectric multiplier (inverse embodiment).

Figure 6:
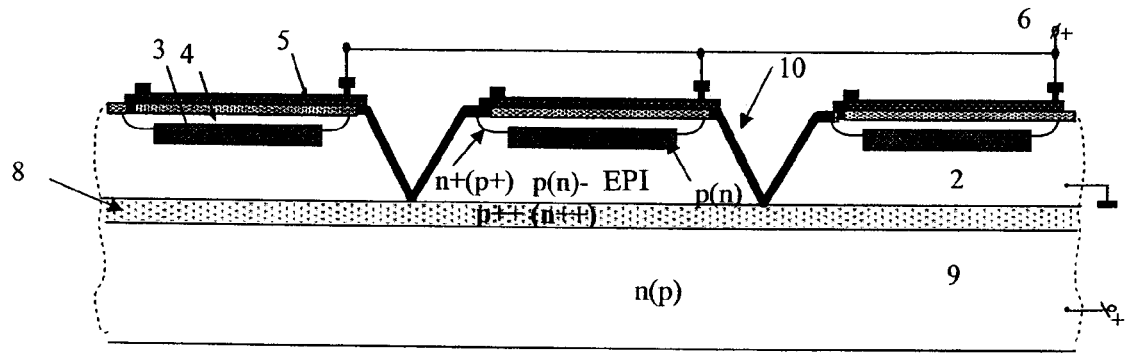

FIG. 6 presents the second embodiment of the silicon photoelectric multiplier (inverse embodiment).

The silicon photoelectric multiplier pursuant to the first embodiment contains p++ conductance type substrate 1, epitaxial layer 2 (EPI), grown on substrate 1, p conductance type layer 3, n+ conductance type layer 4 polysilicon resistor 5, connecting layer 4 with voltage distribution bus 6, silicon oxide layer 7, separating elements 10.

The silicon photoelectric multiplier pursuant to the second embodiment contains, except for the above indicated elements and connections, p++ conductance type layer 8 and n-conductance type substrate 9 (instead of p++ conductance type substrate 1).

The cell for the silicon photoelectric multiplier comprises p conductance type epitaxial layer 2 having $10^{18}$-$10^{14}$ cm$^{-3}$ of a doping agent concentration varied gradually, p conductance type layer 3 having $10^{15}$-$10^{17}$ cm$^{-3}$ of the doping agent concentration, n+ layer which forms the donor part of a p-n boundary, and which has $10^{18}$-$10^{20}$ cm$^{-3}$ of the doping agent concentration, polysilicon resistor 5 is located in each cell on silicon oxide layer 7 applied on a photosensitive surface of the epitaxial layer, said resistor 5 connects n+ layer 4 with voltage distribution bus 6. The efficient light detection in a broad part of the spectrum (300-900 nm) along with the low working voltage and high uniformity of an electrical field is reached in such the structure by creation of the built-in electrical field, which arises due to the doping agent distribution gradiant profile specially formed in the epitaxial layer.

The doping agent concentration in the epitaxial layer is depressed in the direction from the substrate to the photosensitive surface of the photoelectric multiplier, said photosensitive surface is the epitaxial layer surface (photosensitive surface of the epitaxial layer) remoted from the substrate. Silicon oxide layer 7 is applied on the photosensitive surface of the silicon photoelectric multiplier, namely, on the photosensitive surface of the epitaxial layer. Polysilicon resistor 5, connecting n+ layer 4 with voltage distribution bus 6, is located in each cell on layer 7 of silicon oxide. Separating elements 10 executing particularly function of optical barriers are disposed between the cells.

The epitaxial layer (second embodiment of the silicon photoelectric multiplier) is grown on p++ conductance type layer 8, located on n conductance type substrate 9 ($10^{15}$-$10^{17}$ cm$^{-3}$ of the doping agent concentration). A second (reverse) n-p boundary is made between p conductance type layers 3 and substrate 9, said boundary prevents penetration of photoelectrons, created by secondary photons of the Geiger discharge, into the sensitive region of adjacent cells. Besides the penetration of the secondary Geiger photons into the adjacent cells is prevented due to fulfillment of the separating elements (optical barriers) between the cells, (which, for example, can be the triangular form (V-groove)) by anisotropic etching of silicon having orientation <100>.

The silicon photoelectric multiplier comprises the independent cells having 20-100 microns of the size. All the cells are jointed with an aluminium bus, and the identical bias voltage, exceeded the breakdown voltage, is applied to the cells, that provides working in the Geiger mode. The quenched Geiger discharge develops in the active region of the cell when a photon gets there. The quenching, that is stopping the discharge, takes place due to fluctuations of the number of the charge carriers up to zero when the voltage of the p-n boundary drops, due to availability of polysilicon resistor 5 (current-limiting resistor) in each the cell. The current signals from the worked cells are summarized on a common load. The amplification of each cell constitutes up to $10^7$. The spread of amplification value is defined by technological spread of the cell capacity and breakdown voltage of the cell, and constitutes less than 5%. As all the cells are identical, the response of the detector to gentle light flashes is proportional to number of the worked cells, i.e. to light intensity.

One of the features of working in the Geiger mode is the linear dependence of cell amplification from a bias voltage, that reduces requirements for stability of a power supply voltage and for a thermal stability.

Common bus 6 (anode) is supplied with positive voltage, its value should provide the Geiger mode (typical value lies in the range of U=+20-60 v), and also provide necessary depletion depth of the layers equal to 1-2 microns. At absorption of a light quantum the created charge carriers are agglomerated not from the depletion region only, but also from the undepletion transitory region, in which the built-in electrical field is due to gradient of doping agent, said field forces electrons to move to the anode. Thus, the great depth of charge congregating is reached, that significant exceeds a depth of the depletion region, defined a low working voltage. It provides maximum high light detection efficiently at fixed cell layout and fixed working voltage.

The value of polysilicon resistor 5 is selected from a condition of sufficiency for extinguishing of the avalanche discharge. The resistor is technologically simple in manufacturing. The important feature is that the resistor is applied on a cell periphery, not occluding an active part, i.e. not reducing the light detection efficiency.

In order to block connections between the cells the separating elements are disposed in the structure of the silicon photoelectric multiplier between the cells, for example, separating elements having triangular form (formed, for example, at anisotropic etching of silicon with orientation <100> in fluid etches on the base of KOH).

Allowing, that the processes in p-n and n-p boundaries run identically (with allowance for reverse signs of the electric charge carriers), at fulfillment of the claimed devices in the inverse embodiment (the layers with definite conductance type are varied to the inverse type), as shown in FIGS. 4-6, their working is realized similarly, as it described for the claimed invention in the present description of the invention and in the claims. Thus the features of the inverse embodiments of the claimed devices are equivalent to the features, mentioned in the current description of the invention and in the claims.

The invention claimed is:

1. A silicon photoelectric multiplier comprising:
    a p++ conductance type substrate having $10^{18}$-$10^{20}$ cm$^{-3}$ of a doping agent concentration; a plurality of cells, each cell including:
        a p conductance type epitaxial layer having $10^{18}$-$10^{14}$ cm$^{-3}$ of the doping agent concentration varied gradually, said epitaxial layer grown on the substrate;
        a p conductance type layer having $10^{15}$-$10^{17}$ cm$^{-3}$ of the doping agent concentration;
        an n+ conductance type layer having $10^{18}$-$10^{20}$ cm$^{-3}$ of the doping agent concentration; and
        a polysilicon resistor located on a silicon oxide layer in each cell, said polysilicon resistor connecting the n+ conductance type layer with a voltage distribution bus; and separating elements disposed between the cells.

2. A silicon photoelectric multiplier comprising:
    an n conductance type substrate;
    a p++ conductance type layer having $10^{18}$-$10^{20}$ cm$^{-3}$ of a doping agent concentration, said p++ conductance type layer applied on said substrate;
    a plurality of cells, each cell including:
        a p conductance type epitaxial layer having $10^{18}$-$10^{14}$ cm$^{-3}$ of the doping agent concentration varied gradually, said p conductance type layer grown on the p++ conductance type layer;

a p conductance type layer having $10^{15}$-$10^{17}$ cm$^{-3}$ of the doping agent concentration;

an n+ conductance type layer having $10^{18}$-$10^{20}$ cm$^{-3}$ of the doping agent concentration; and a polysilicon resistor is located on a silicon oxide layer in each cell, said polysilicon resistor connecting the n+ conductance type layer with a voltage distribution bus; and separating elements disposed between the cells.

3. A cell of a silicon photoelectric multiplier, comprising a p conductance type epitaxial layer having $10^{18}$-$10^{14}$ cm$^{-3}$ of a doping agent concentration varied gradually, a p conductance type layer having $10^{15}$-$10^{17}$ cm$^{-3}$ of the doping agent concentration, an n+ layer, forming a donor part of a p-n boundary, and having $10^{18}$-$10^{20}$ cm$^{-3}$ of the doping agent concentration, and a polysilicon resistor located on a silicon oxide layer, said resistor connecting the n+ layer with a voltage supply bus.

4. A silicon based photo-electric multiplier, comprising:
an n/p substrate of a second conductivity type;
a p++/n++ doping layer of a first conductivity type formed on the substrate, the doping layer and the substrate forming a first n-p junction at an interface therebetween;
a plurality of cells, the cells being arranged above the doping layer and each one of the cells comprising:
a p/n epitaxial layer of the first conductivity type formed on the doping layer;
a p/n first layer of the first conductivity type formed within the expitaxial layer;
an n+/p+ second layer of a second conductivity type formed on the first layer, the first layer and the second layer forming a second n-p junction at an interface therebetween;
an insulation layer formed on the second layer; and
a resistor located on the insulation layer and connecting the second layer to a voltage distribution bus; and
wherein the epitaxial layer comprises a spatial gradient in the doping concentration, a doping concentration being decreased from a relatively high value at a boundary between the epitaxial layer and the doping layer to a relatively low value at a photosensitive surface of the epitaxial layer in order to create a built-in electrical field of high uniformity within the expitaxial layer.

5. The silicon based photo-electric multiplier according to claim 4, wherein the doping layer comprises a doping level in the range $10^{18}$-$10^{20}$ cm$^{-3}$.

6. The silicon based photo-electric multiplier according to claim 5, wherein a doping concentration of the first layer is in a range of $10^{15}$-$10^{17}$ cm$^{-3}$.

7. The silicon based photo-electric multiplier according to claim 5, wherein the spatial gradient in the doping concentration of the epitaxial layer is formed by a spatial variation of the doping concentration from $10^{14}$ to $10^{18}$ cm$^{-3}$.

8. The silicon based photo-electric multiplier according to claim 7, wherein a doping concentration of the first layer is in a range of $10^{15}$-$10^{17}$ cm$^{-3}$.

9. The silicon based photo-electric multiplier according to claim 4, wherein the spatial gradient in the doping concentration of the epitaxial layer is formed by a spatial variation of the doping concentration from $10^{14}$ to $10^{18}$ cm$^{-3}$.

10. The silicon based photo-electric multiplier according to claims 9, wherein a doping concentration of the first layer is in a range of $10^{15}$-$10^{17}$ cm$^{-3}$.

11. The silicon based photo-electric multiplier according to anyone of claims 4, wherein a doping concentration of the first layer is in a range of $10^{15}$-$10^{17}$ cm$^{-3}$.

12. The silicon based photo-electric multiplier according to claim 4, wherein the insulation layer comprises silicon oxide.

13. The silicon based photo-electric multiplier according to claim 4, wherein the resistor comprises polysilicon.

14. The silicon based photo-electric multiplier according to any one of claims 4 to 13, wherein separating elements are disposed between the cells.

15. The silicon based photo-electric multiplier according to claim 14, wherein the separating elements are formed as triangular V-grooves obtainable by anisotropic etching of the silicon.

16. A silicon based photo-electric multiplier, comprising:
a substrate of a first conductivity type;
a plurality of cells, the cells being arranged above the substrate and each one of the cells comprising:
an epitaxial layer of the first conductivity type formed on the substrate;
a first layer of the first conductivity type formed within the epitaxial layer;
a second layer of a second conductivity type formed on the first layer, the first layer and the second layer forming an n-p junction at an interface there between,
an insulation layer formed on the second layer; and
a resistor located on the insulation layer and connecting the second layer to a voltage distribution bus; and
wherein the epitaxial layer comprises a spatial gradient in the doping concentration, the doping concentration being decreased from a relatively high value at a boundary between the epitaxial layer and a doping layer to a relatively low value at a photosensitive surface of the epitaxial layer in order to create a built-in electrical field of high uniformity within the epitaxial layer.

17. The silicon based photo-electric multiplier according to claim 16, wherein a doping layer comprises a doping level in the range $10^{18}$-$10^{20}$ cm$^{-3}$.

18. The silicon based photo-electric multiplier according to claim 17, wherein a doping concentration of the first layer is in a range of $10^{15}$-$10^{17}$ cm$^{-3}$.

19. The silicon based photo-electric multiplier according to claim 17, wherein the spatial gradient in the doping concentration of the epitaxial layer is formed by a spatial variation of the doping concentration from $10^{14}$ to $10^{18}$ cm$^{-3}$.

20. The silicon based photo-electric multiplier according to claim 19, wherein a doping concentration of the first layer is in a range of $10^{15}$-$10^{17}$ cm$^{-3}$.

21. The silicon based photo-electric multiplier according to claim 16, wherein the spatial gradient in the doping concentration of the epitaxial layer is formed by a spatial variation of the doping concentration from $10^{14}$ to $10^{18}$ cm$^{-3}$.

22. The silicon based photo-electric multiplier according to claims 21, wherein a doping concentration of the first layer is in a range of $10^{15}$-$10^{17}$ cm$^{-3}$.

23. The silicon based photo-electric multiplier according to anyone of claims 16, wherein a doping concentration of the first layer is in a range of $10^{15}$-$10^{17}$ cm$^{-3}$.

24. The silicon based photo-electric multiplier according to claim 16, wherein the insulation layer comprises silicon oxide.

25. The silicon based photo-electric multiplier according to claim 16, wherein the resistor comprises polysilicon.

26. The silicon based photo-electric multiplier according to any one of claims 16 to 25, wherein separating elements are disposed between the cells.

27. The silicon based photo-electric multiplier according to claim 26, wherein the separating elements are formed as triangular V-grooves obtainable by anisotropic etching of the silicon.

* * * * *